(12) United States Patent
Cheng et al.

(10) Patent No.: US 9,680,015 B2
(45) Date of Patent: Jun. 13, 2017

(54) DUAL EPITAXY CMOS PROCESSING USING SELECTIVE NITRIDE FORMATION FOR REDUCED GATE PITCH

(71) Applicant: International Business Machines Corporation, Armonk, NY (US)

(72) Inventors: Kangguo Cheng, Schenectady, NY (US); Ali Khakifirooz, Los Altos, CA (US); Richard S. Wise, Los Altos, CA (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 14/882,618

(22) Filed: Oct. 14, 2015

(65) Prior Publication Data

US 2016/0148931 A1     May 26, 2016

Related U.S. Application Data

(62) Division of application No. 14/551,260, filed on Nov. 24, 2014.

(51) Int. Cl.
*H01L 29/02*     (2006.01)
*H01L 29/78*     (2006.01)
(Continued)

(52) U.S. Cl.
CPC .... *H01L 29/7848* (2013.01); *H01L 21/02247* (2013.01); *H01L 21/02252* (2013.01);
(Continued)

(58) Field of Classification Search
CPC H01L 27/092; H01L 29/6653; H01L 21/8238
See application file for complete search history.

(56) References Cited

U.S. PATENT DOCUMENTS 9,166,045 B1 * 10/2015 Hsu ..................... H01L 21/8232
2009/0047768 A1 * 2/2009 Jain ..................... H01L 21/2251
                                                                         438/306
(Continued)

OTHER PUBLICATIONS

Cheng et al., "Dual Epitaxy CMOS Processing Using Selective Nitride Formation for Reduced Gate Pitch", U.S. Appl. No. 14/551,260, filed Nov. 24, 2014.
(Continued)

*Primary Examiner* — Trung Q Dang
*Assistant Examiner* — Wasiul Haider
(74) *Attorney, Agent, or Firm* — Cantor Colburn LLP; Steven Meyers

(57) ABSTRACT

A method of forming a complementary metal oxide semiconductor (CMOS) device structure includes forming a spacer layer material over a substrate and over gate structures defined in a first polarity type region and a second polarity type region; selectively etching the spacer layer material in the first polarity type region to form first gate sidewall spacers; forming first epitaxially grown source/drain (SD) regions in the first polarity type region; selectively forming a protection layer only on exposed surfaces of the first SD regions, so as not to increase a thickness of the spacer layer material in the second polarity type region; forming a masking layer over the first polarity type region, and etching the spacer layer material in the second polarity type region to form second gate sidewall spacers; and removing the masking layer and forming second epitaxially grown SD regions in the second polarity type region.

5 Claims, 6 Drawing Sheets

(51) Int. Cl.
*H01L 21/02* (2006.01)
*H01L 21/265* (2006.01)
*H01L 21/266* (2006.01)
*H01L 21/311* (2006.01)
*H01L 21/8238* (2006.01)
*H01L 27/092* (2006.01)
*H01L 29/161* (2006.01)
*H01L 29/66* (2006.01)

(52) U.S. Cl.
CPC ...... *H01L 21/02532* (2013.01); *H01L 21/266* (2013.01); *H01L 21/26513* (2013.01); *H01L 21/26566* (2013.01); *H01L 21/31111* (2013.01); *H01L 21/823814* (2013.01); *H01L 21/823821* (2013.01); *H01L 27/0922* (2013.01); *H01L 27/0924* (2013.01); *H01L 29/161* (2013.01); *H01L 29/6653* (2013.01); *H01L 29/6656* (2013.01)

(56) References Cited

U.S. PATENT DOCUMENTS

| 2011/0049567 A1* | 3/2011 | Peng | H01L 21/30608 257/190 |
| 2013/0256808 A1* | 10/2013 | Yin | H01L 21/823807 257/392 |
| 2014/0021556 A1* | 1/2014 | Lii | H01L 27/092 257/369 |
| 2014/0077229 A1* | 3/2014 | Liu | H01L 29/66795 257/77 |
| 2016/0064521 A1* | 3/2016 | Hung | H01L 21/823807 438/301 |

OTHER PUBLICATIONS

List of IBM Patents or Patent Applications Treated as Related; (Appendix P), filed Oct. 14, 2015; 2 pages.

* cited by examiner

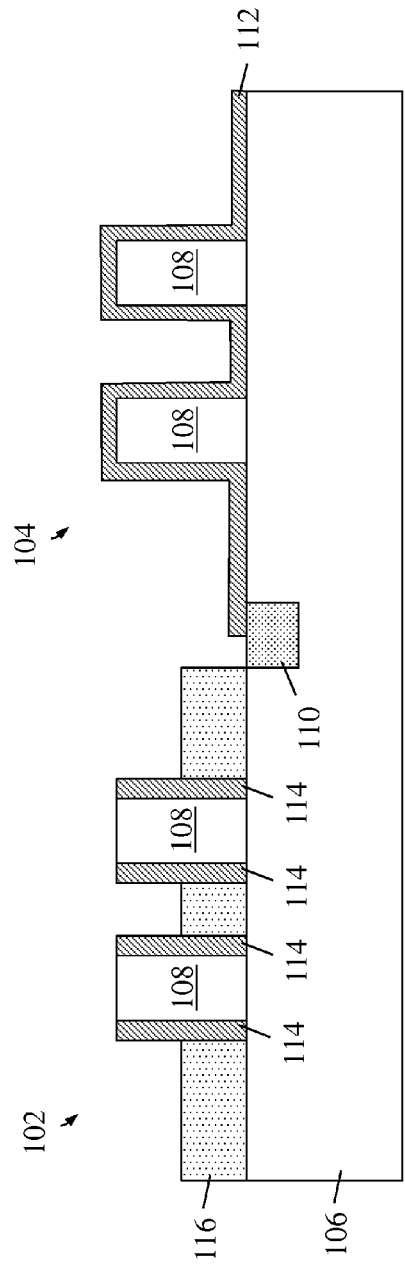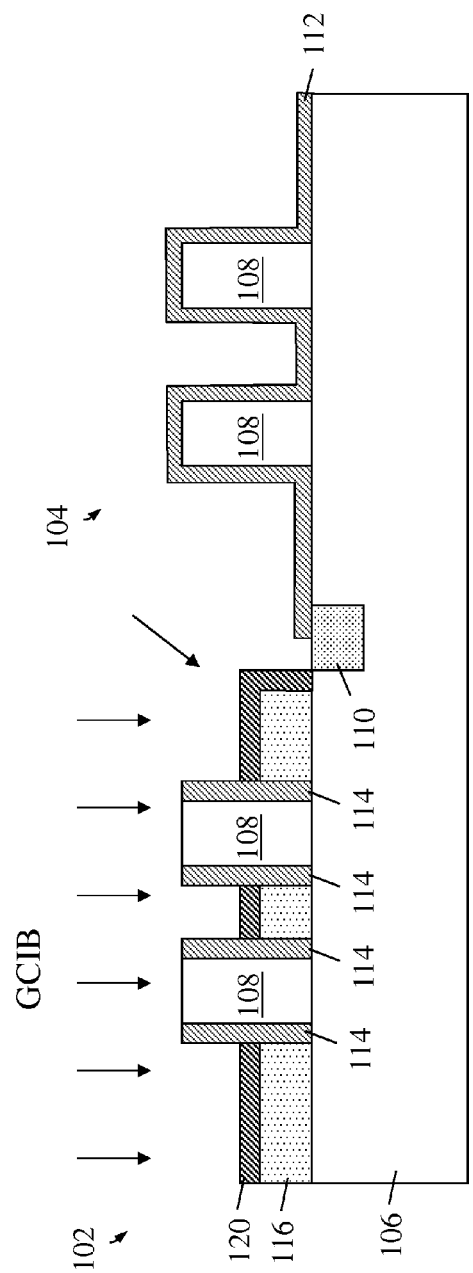
Figure 4
Figure 5

DUAL EPITAXY CMOS PROCESSING USING SELECTIVE NITRIDE FORMATION FOR REDUCED GATE PITCH

DOMESTIC PRIORITY

This application is a division of U.S. patent application Ser. No. 14/551,260, filed Nov. 24, 2014, the disclosure of which is incorporated by reference herein in its entirety.

BACKGROUND

The present invention relates generally to semiconductor device manufacturing and, more particularly, to dual epitaxy complementary metal oxide semiconductor (CMOS) processing using selective nitride formation for reduced gate pitch.

Field effect transistors (FETs) are widely used in the electronics industry for switching, amplification, filtering, and other tasks related to both analog and digital electrical signals. Most common among these are metal-oxide-semiconductor field effect transistors (MOSFET or MOS), in which a gate structure is energized to create an electric field in an underlying channel region of a semiconductor body, by which electrons are allowed to travel through the channel between a source region and a drain region of the semiconductor body. CMOS devices have become widely used in the semiconductor industry, wherein both n-type and p-type (NFET and PFET) FETs are used to fabricate logic and other circuitry.

The source and drain regions of an FET are typically formed by adding dopants to targeted regions of a semiconductor body on either side of the channel. A gate structure is formed above the channel, which includes a gate dielectric located over the channel and a gate conductor above the gate dielectric. The gate dielectric is an insulator material, which prevents large leakage currents from flowing into the channel when a voltage is applied to the gate conductor, while allowing the applied gate voltage to set up a transverse electric field in the channel region in a controllable manner. Conventional MOS transistors typically include a gate dielectric formed by depositing or by growing silicon dioxide ($SiO_2$) or silicon oxynitride (SiON) over a silicon wafer surface, with doped polysilicon formed over the $SiO_2$ to act as the gate conductor.

Continuing trends in semiconductor device manufacturing include reduction in electrical device feature sizes (i.e., scaling), as well as improvements in device performance in terms of device switching speed and power consumption. MOS transistor performance may be improved by reducing the distance between the source and the drain regions under the gate conductor of the device, known as the gate or channel length, and by reducing the thickness of the layer of gate dielectric that is formed over the semiconductor surface.

SUMMARY

In one embodiment, a method of forming a complementary metal oxide semiconductor (CMOS) device structure includes forming a spacer layer material over a substrate and over gate structures defined in both a first polarity type region and a second polarity type region of the substrate; selectively etching the spacer layer material in the first polarity type region to form first gate sidewall spacers, leaving the spacer layer material in the second polarity type region intact; forming first epitaxially grown source/drain (SD) regions in the first polarity type region; selectively forming a protection layer only on exposed surfaces of the first epitaxially grown SD regions, so as not to increase a thickness of the spacer layer material in the second polarity type region; forming a masking layer over the first polarity type region, and etching the spacer layer material in the second polarity type region to form second gate sidewall spacers; and removing the masking layer and forming second epitaxially grown SD regions in the second polarity type region, wherein the selectively formed protection layer prevents additional growth of epitaxial material on the first epitaxially grown SD regions.

In another embodiment, a method of forming a complementary metal oxide semiconductor (CMOS) device structure includes forming a nitride spacer layer material over a substrate and over gate structures defined in both a first polarity type region and a second polarity type region of the substrate; selectively etching the nitride spacer layer material in the first polarity type region to form first gate sidewall spacers, leaving the nitride spacer layer material in the second polarity type region intact; forming first epitaxially grown source/drain (SD) regions in the first polarity type region; selectively forming a protective nitride layer only on exposed surfaces of the first epitaxially grown SD regions using a gas cluster ion beam (GCIB) process, so as not to increase a thickness of the nitride spacer layer material in the second polarity type region; forming a masking layer over the first polarity type region, and etching the nitride spacer layer material in the second polarity type region to form second gate sidewall spacers; and removing the masking layer and forming second epitaxially grown SD regions in the second polarity type region, wherein the selectively formed protection layer prevents additional growth of epitaxial material on the first epitaxially grown SD regions.

In another embodiment, a complementary metal oxide semiconductor (CMOS) device includes a substrate; gate structures formed in both a first polarity type region and a second polarity type region of the substrate, the gate structures having sidewall spacers adjacent thereto; first epitaxially grown source/drain (SD) regions formed in the first polarity type region; a protection layer selectively formed only on surfaces of the first epitaxially grown SD regions; and second epitaxially grown SD regions formed in the second polarity type region.

BRIEF DESCRIPTION OF THE DRAWINGS

Referring to the exemplary drawings wherein like elements are numbered alike in the several Figures:

FIGS. 4-8 illustrate a method of implementing CMOS device processing in accordance with an exemplary embodiment, in which:

FIG. 4 illustrates the formation of nitride spacers on the NFET gate structures and first epitaxial source/drain regions;

FIG. 5 illustrates the selective formation of a gas cluster ion beam (GCIB) nitride layer only on the exposed portions of the first epitaxial source/drain regions;

FIG. 6 illustrates masking of the NFET region and the removal of the dummy gate stack structure of FIG. 5, and the formation of nitride spacers on the PFET gate structures;

FIG. 7 illustrates the formation of second epitaxial source/drain regions;

FIG. 8 illustrates additional stages of CMOS device processing; and

DETAILED DESCRIPTION

With respect to the above described device scaling, ultra-thin body silicon MOSFETs, such as ETSOI (extremely thin SOI) or FinFETs, are considered viable options for CMOS scaling for the 22 nanometer (nm) node and beyond. However, a thin-body SOI transistor such an ETSOI transistor or FinFET transistor with a thin fin channel utilizes epitaxially grown, source/drain (SD) regions to achieve a sufficiently low transistor series resistance, as well as to apply an appropriate strain to the channel to enhance carrier mobility. The material used for the epitaxially grown SD regions depends upon whether the transistor is an NFET or a PFET, and thus two separate epitaxial processes are used in forming such CMOS devices.

The current dual epitaxy process in which a hardmask is used to protect a first formed of the two epitaxial regions will present problems for future technology nodes such as the 7 nm node given the following projected technology features: a contacted gate pitch (CPP) of 45 nm, a gate length (Lg) of 15 nm, and a spacer thickness of 9 nm. Even assuming a self-aligned contact, these dimensions result in a contact opening of 12 nm (45 nm–15 nm–2×9 nm). Adding to this, in a conventional dual epitaxy scheme, a minimal 3 nm hardmask is needed to protect the first formed epitaxial regions. However, by forming 3 nm of additional hardmask material on spacer sidewalls, the contact opening is then reduced to only about 6 nm (12 nm–2×3 nm). This is prohibitively challenging, if not impossible, to be manufacturable taking into account process variations (for example, gate pitch walking due to sidewall image transfer (SIT) process, Lg variation, etc.)

Figure 1:
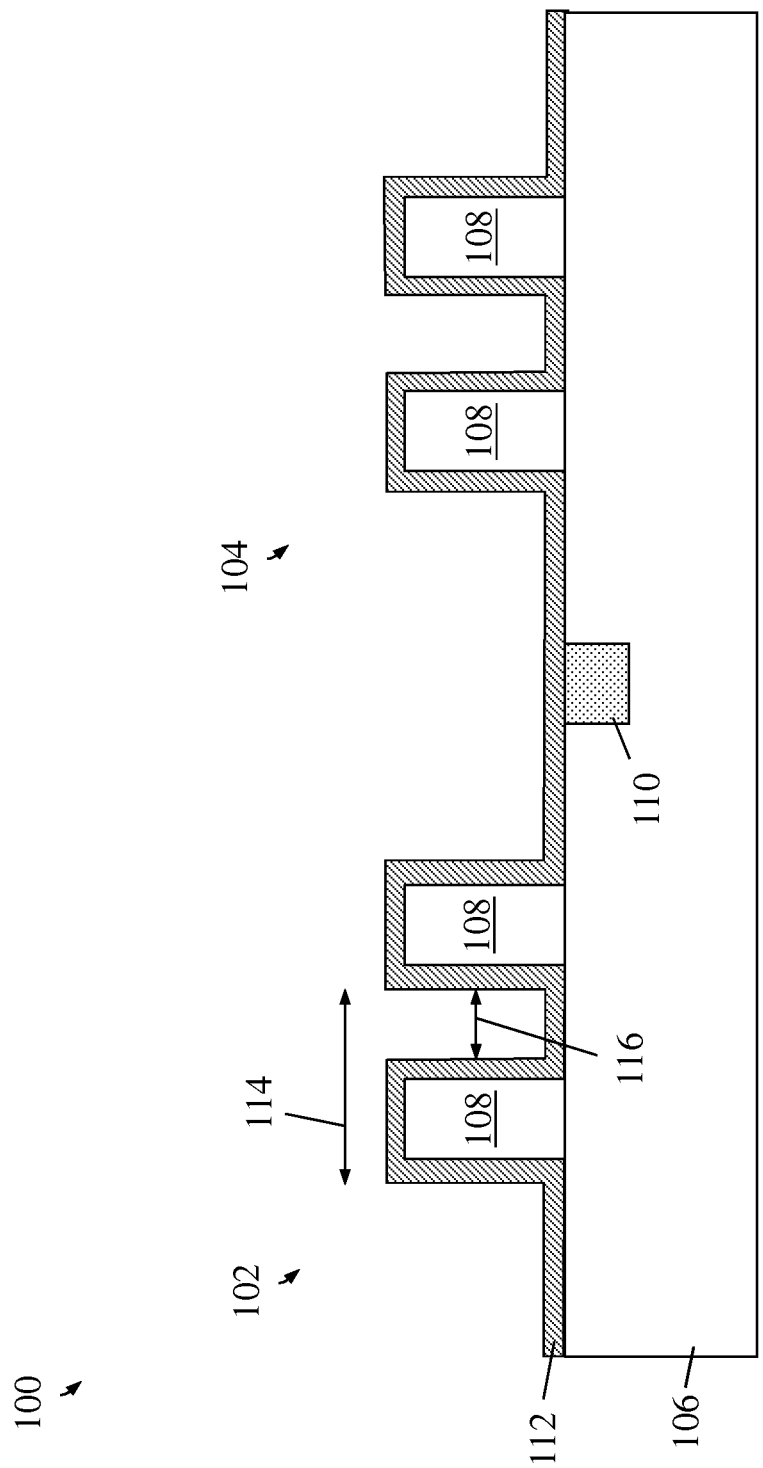
FIG. 1 is a cross sectional view of a processing stage in CMOS device fabrication in which a nitride spacer layer is formed over NFET and PFET regions of the device.

This scenario is further illustrated with reference to FIG. 1 through 3. In particular, FIG. 1 is a cross sectional view of a processing stage for a CMOS device 100 having an NFET region 102 and a PFET region 104. As also shown in FIG. 1, the CMOS device 100 includes a semiconductor substrate 106 having a plurality of gate structures 108 formed therein, in both the NFET region 102 and the PFET region 104.

The semiconductor substrate 106 includes a semiconductor material, which may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Where the semiconductor material of the semiconductor substrate 106 is a single crystalline silicon-containing semiconductor material, the single crystalline silicon-containing semiconductor material may be selected from single crystalline silicon, a single crystalline silicon carbon alloy, a single crystalline silicon germanium alloy, and a single crystalline silicon germanium carbon alloy.

The semiconductor material of the semiconductor substrate 106 may be appropriately doped either with p-type dopant atoms or with n-type dopant atoms. The dopant concentration of the semiconductor substrate 106 may range from about $1.0 \times 10^{15}$ atoms/cm3 to about $1.0 \times 10^{19}$ atoms/cm3, and more specifically from about $1.0 \times 10^{16}$ atoms/cm3 to about $3.0 \times 10^{18}$ atoms/cm3, although lesser and greater dopant concentrations are contemplated herein also. In addition, the semiconductor substrate 106 may be a bulk substrate, a semiconductor-on-insulator or silicon-on-insulator (SOI) substrate, or a hybrid substrate.

The gate structures 108 may generally represent structures from a gate first process including, for example, an interfacial layer, a gate dielectric layer such as a high-k material, and one or more gate conductor layers such as metals and/or polysilicon. Alternatively, the gate structures 108 may represent dummy gate structures as used in a gate last or gate replacement process, wherein the dummy gate structures are removed and replaced with high-k/metal gate materials following the formation of source and drain regions.

As further shown in FIG. 1, the substrate 106 may include one or more isolation regions such as shallow trench isolation (STI) regions 110 formed therein, which provide electrical isolation between devices, such as NFETs and PFETs. The isolation region 110 may include any suitable dielectric material(s) such as silicon oxide, silicon nitride, or combination of both materials. The isolation region 110 can be formed by any techniques known in the art, such as by patterning/etching/deposition, implantation, etc. In addition to the isolation region 110, the substrate 106 may also have other structures formed therein, such as fins, wells, deep isolation regions, etc., which are not specifically shown for ease of illustration.

At the point of processing shown in FIG. 1, a spacer layer 112 is formed over both the NFET 102 region and the PFET region 104 of the device 100, as well as over the substrate 106 and STI region 110. As indicated above, for a gate pitch of about 45 nm (indicated by arrow 114) and a nitride spacer material thickness of about 9 nm, there is an opening of about 12 nm (indicated by arrow 116) for a source/drain region between adjacent gate structures 108. It should be noted that the dimensions shown in the figures are exemplary and are not intended to be depicted to scale.

Figure 2:
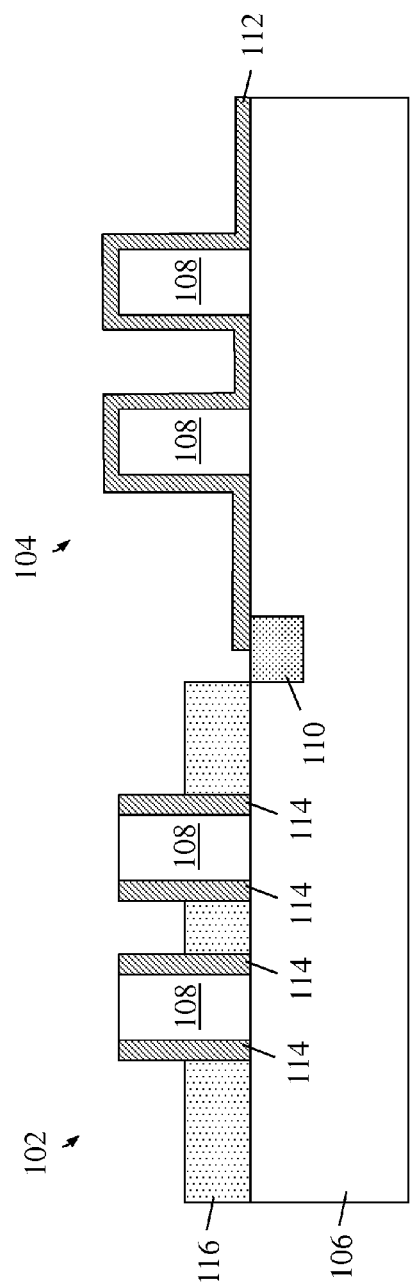
FIG. 2 illustrates the formation of nitride spacers on the NFET gate structures and first epitaxial source/drain regions.
Figure 3:
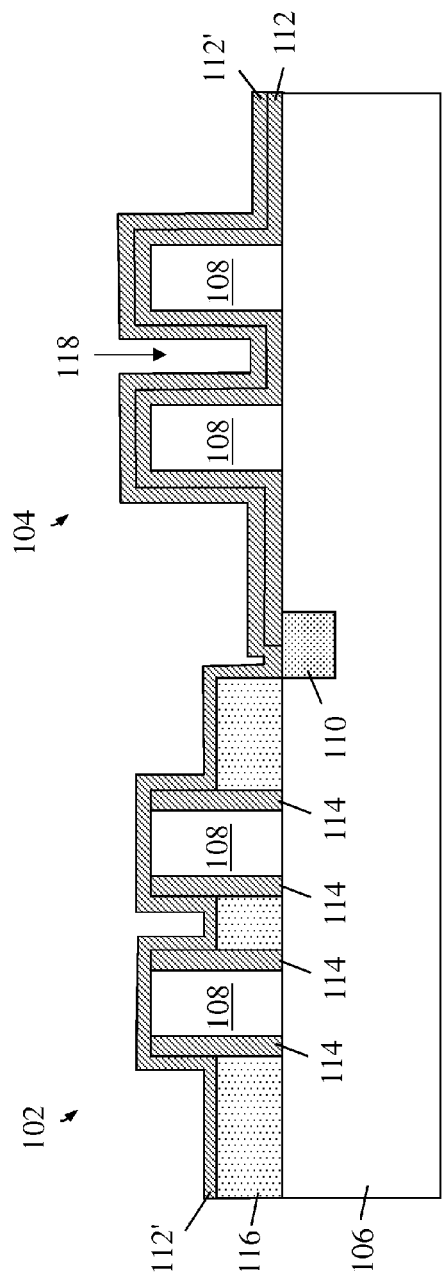
FIG. 3 illustrates the formation of another nitride layer over both NFET and PFET regions of the device to mask the first epitaxial source/drain regions prior to forming second epitaxial source/drain regions in the PFET region.

Referring now to FIG. 2, one of the two regions has been masked and anisotropic (directional) reactive ion etching RIE performed as known in the art to define gate sidewall spacers 114. In the example illustrated, the PFET region 104 is masked first so that the gate sidewall spacers 114 are etched for the NFET region 102, after which first epitaxially grown SD regions 116 are formed in the NFET region. In the case of an NFET device, the first epitaxially grown SD regions 116 may be selected from a material that will serve to provide a tensile stress on an NFET channel, such as silicon carbon (Si:C) for example. It should also be appreciated at this point that the NFET region 102 could also be masked first such that gate sidewall spacers are first formed in the PFET region 104, followed by SD region formation therein. In any case, once the first epitaxially grown SD regions 116 are formed in the NFET region 102, they are then protected from further epitaxial growth of material used to form SD regions in the PFET region 104. At elevated temperatures associated with epitaxial growth and SD doping, photoresist materials are not suitable for protecting the first region of already formed SD semiconductor material. Thus, the current processes utilize the formation of an additional hardmask layer 112' over the entirety of both the NFET region 102 and the PFET region 104 prior to the second epitaxial process, as shown in FIG. 3.

The additional nitride layer 112', formed at a thickness of about 3 nm for example, may only leave an opening 118 of about 6 nm between adjacent gate structures 108 in the PFET region. Taking process variations into consideration, this opening 118 could conceivably be clogged or even completely absent in some cases. Consequently, this condition may make it difficult to properly form gate sidewall spacers by RIE in this region having the extra nitride spacer layer thickness at tight pitches. There is therefore a need for innovation in enabling dual epitaxy CMOS fabrication for future technology with highly scaled gate pitch.

Accordingly, disclosed herein is a method and structure for dual epitaxy CMOS processing using selective nitride formation for reduced gate pitch. As described in further detail below, instead of forming a protective nitride layer over the entire device, a selective nitride layer is formed only on the exposed surfaces of the first formed epitaxial semiconductor material, so as not to unnecessarily increase the nitride spacer thickness in the other region of the device where the gate sidewall spacers have not yet been etched. In the exemplary embodiments presented, the selective nitridation is implemented via a gas cluster ion beam (GCIB) process.

Returning to the above example, FIG. 4 illustrates the same point of process as was described in FIG. 2. That is, gate sidewall spacers 114 have been formed in the NFET region 102, as well as first epitaxially grown SD regions 116. Again, it will be appreciated however, that the spacers and SD regions could alternatively have been formed first in the PFET region 104. In some embodiments, the gate pitch ranges from 35 nm to 70 nm, gate length ranges from 10 nm to 25 nm, the spacer thickness ranges from 4 nm to 10 nm. The gate sidewall spacers 114 may be a dielectric material, such as silicon oxide, silicon nitride, silicon oxynitride, a low-k material, or any suitable combination of those materials. The low-k material may be a dielectric having a dielectric constant less than about 7, for example, less than about 5 or even less than about 2.5, such as carbon containing silicon materials such as silicon oxycarbides (SiOC) or silicon carbides, silicon nitrides (SiN) or carbon containing silicon nitride materials (SiCN), and/or boron nitride (BN), silicon boron nitride (SiBN), silicon boron carbide nitride (SiBCN), carbon doped silicon oxynitride (SiOCN), fluorine doped oxide, porous dielectric, or combinations thereof. Generally, the gate sidewall spacers 114 may be formed by other known or additional techniques than those described without deviating from the scope of the embodiments described herein.

The first epitaxially grown SD region 116 may be in-situ doped (where the dopants are incorporated in the film during epitaxy process) or ex-situ doped (where dopants are incorporated in the film after epitaxy). The ex-situ process may include ion implantation, plasma doping or any other suitable technique. For n-type doping, phosphorus or arsenic may be used. For p-type doping, boron may be used. The doping concentrations may range from $1\times10^{19}$ cm-3 to $1.5\times10^{21}$ cm-3, and more preferably from $4\times10^{20}$ cm-3 to $9\times10^{20}$ cm-3.

As shown in FIG. 5, a selective protection layer 120 is formed only on the exposed surfaces of the first epitaxially grown SD regions 116. In one embodiment, the selective protection layer 120 includes nitride formed by using GCIB nitridation. In another embodiment, the selective protection layer 120 includes oxide formed by using GCIB oxidation. The selective protection layer 120 has a thickness ranging from 3 nm to 15 nm. In GCIB processing, a surface is bombarded by a beam of high energy, gas phase atomic clusters. The clusters are formed when a high pressure gas (e.g., 10 atmospheres) supersonically expands into a vacuum (e.g., $1\times10$-5 Torr), cools, and then condenses into weakly ionized clusters. The ionized clusters are accelerated electrostatically to very high velocities, and are focused into a tight beam that impacts a substrate surface. As opposed to a more dispersed ion implant process, atoms of a cluster ion impact interact nearly simultaneously with the substrate atoms, which produces results such as surface smoothing, pore sealing, shallow cratering, surface chemistry alterations, thin film deposition, and shallow implantation or infusing, depending upon whether the gas clusters are inert or reactive.

A GCIB may include chemical beams of almost any species or mixture, depending on the specific objectives of the processing. Exemplary beams may include, for example, silicon (Si), nitrogen (N) or carbon (C) for film deposition, fluorine (F) for etching, and argon (Ar), N, C, or oxygen (O) for surface modification. In one exemplary embodiment depicted, a nitrogen species is used in the GCIB processing to form a selective nitride protective layer 120. Although it is also contemplated that the protective layer 120 may also be formed by GCIB oxidation as mentioned previously, a nitride layer has a higher etch resistance than oxide for an epitaxy preclean operation. Additional details regarding exemplary GCIB processing are provided hereinafter.

Figure 6:
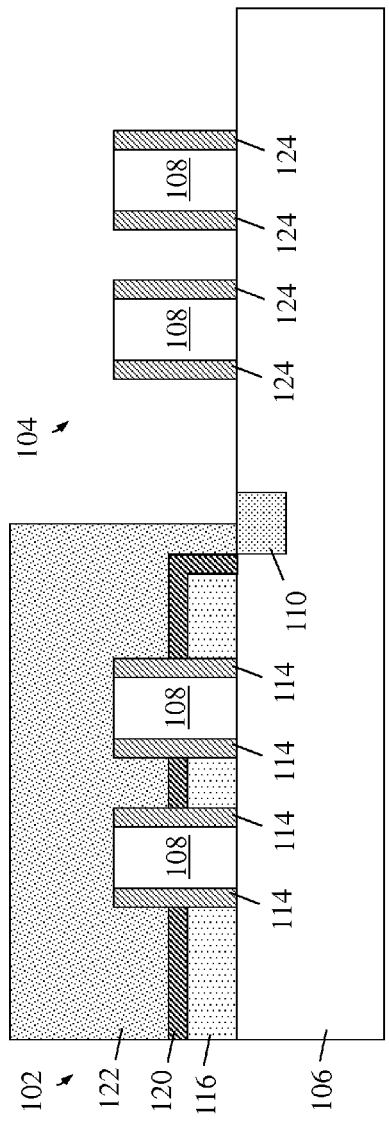
Figure 7:
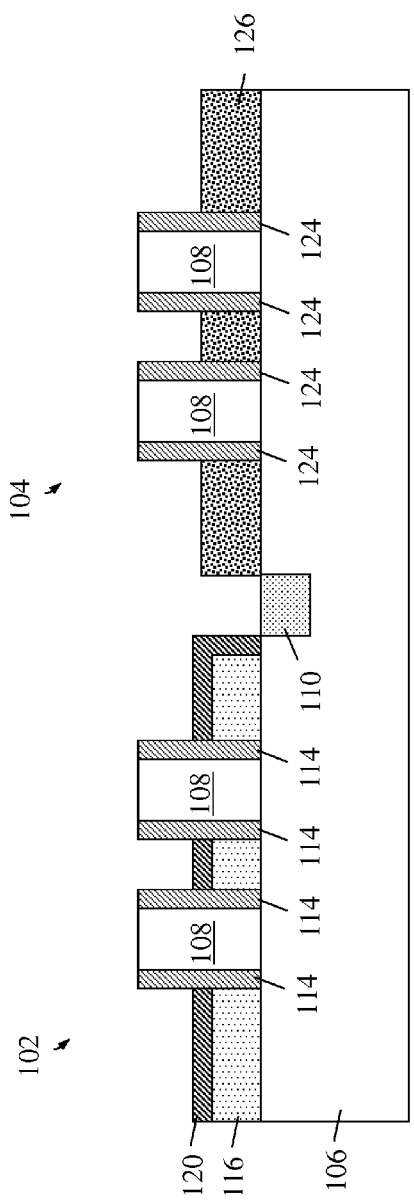

Referring now to FIG. 6, the NFET region 102 is then masked with, for example, a photoresist layer or mask 122 so that RIE may be performed in the PFET region 104 to define gate sidewall spacers 124. Since no additional thickness was present on the first nitride layer 112 in the PFET region 104, sufficient space is maintained between adjacent gate structures 108 so as to allow for the proper formation of the spacers 124. After etching, the mask 122 is removed from the NFET region 102 prior to epitaxial formation in the PFET region, as shown in FIG. 7. With the GCIB nitride layer 102 in place, second epitaxially grown SD regions 126 are formed in the PFET region. In the case of a PFET device, the second epitaxially grown SD regions 126 may be selected from a material that will serve to provide a compressive stress on a PFET channel, such as silicon germanium (SiGe) for example.

Figure 8:
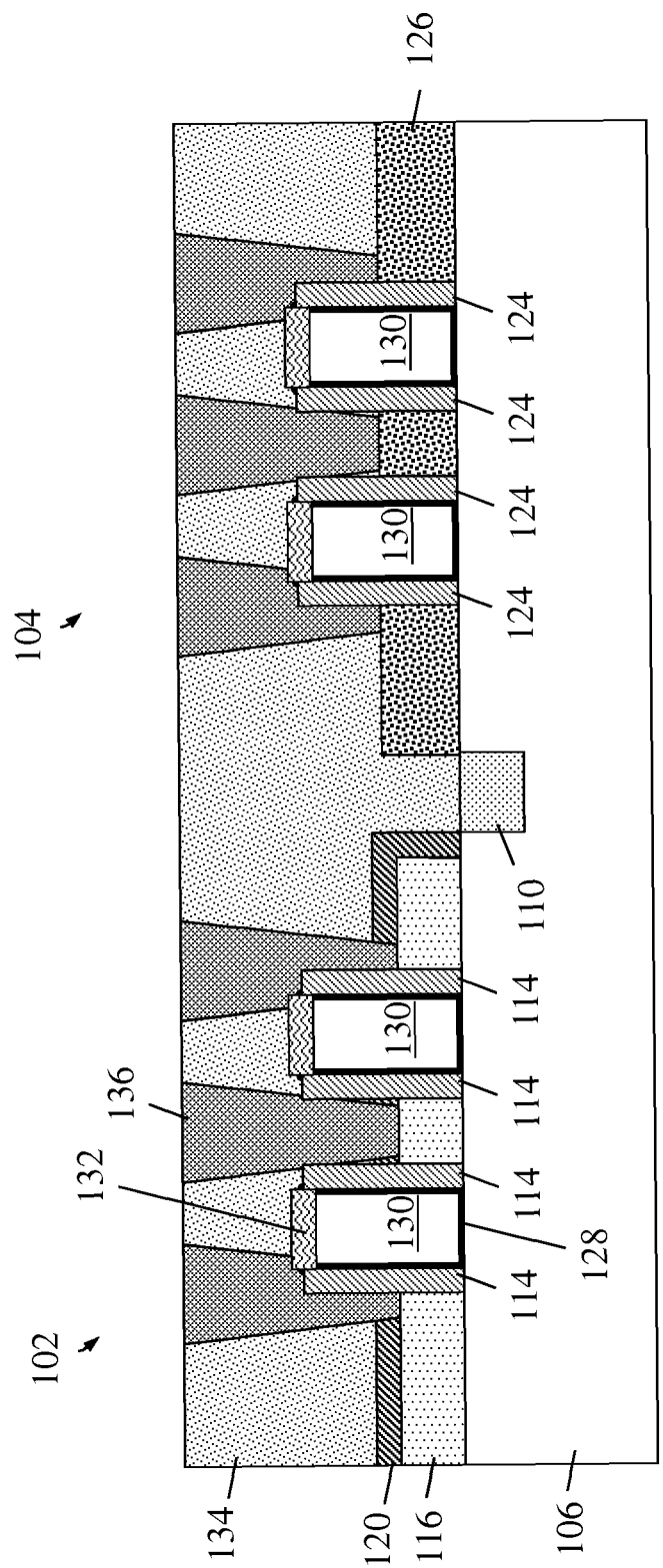

Following the formation of the second epitaxially grown SD regions 126, additional CMOS process as known in the art may continue. For example, source/drain and extension regions (not shown) connecting to the channel region may be formed by any methods known in the art. For example, a thermal anneal process may be performed to drive dopants in the epitaxially grown SD region towards the semiconductor layer under the spacer. In the case of replacement gate technology, this may include, for example, dummy gate removal and the formation and planarization of one or more high-k gate dielectric layers 128 and metal gate layers 130, as illustrated in FIG. 8.

In some examples, the high-k dielectric layer 128 may include a dielectric metal oxide having a dielectric constant that is greater than the dielectric constant (7.5) of silicon nitride, and may be formed by methods well known in the art including, for example, chemical vapor deposition (CVD), ALD, molecular beam deposition (MBD), pulsed laser deposition (PLD), liquid source misted chemical deposition (LSMCD), etc. In an exemplary embodiment, the dielectric metal oxide of the high-k dielectric layer 128 includes a metal and oxygen, and optionally nitrogen and/or silicon. Specific examples of high-k dielectric materials include, but are not limited to: $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the high-k dielectric layer 128 may be from about 1 nm to about 10 nm, and more specifically from about 1.5 nm to about 3 nm.

Following the completion of the final gate structure formation, which may include an insulating cap layer 132, an interlevel dielectric layer 134 (e.g., oxide or low-k material) is formed over the structure, as well as SD contacts 136 (e.g., tungsten or other suitable metal). The cap layer 132 formed atop the gates 130 may prevent shorting between the SD regions 116, 126, and the gates 130 by the contacts 136.

As will thus be appreciated, the above described processing embodiments enable the continued use of dual epitaxial formation for CMOS devices for the 7 nm node and beyond. Other than the initially formed spacer layer, the approach herein does not require any additional spacer material that may otherwise block an S/D opening prior to spacer material etching. As a result, there is a same epitaxial-to-channel distance for both NFET and PFET devices, with the gate sidewall spacers for NFET and PFET devices having a same thickness. Structurally, the first formed epitaxial regions (whether it be NFET or PFET) will have the GCIB nitride layer formed therein, while the second formed epitaxial regions will not. Further, the while the GCIB process is performed at room temperature, the GCIB nitride layer is of sufficiently high quality to protect the first epitaxial regions during precleaning for the second epitaxial process, with no unwanted dopant diffusion during the GCIB nitridation. Moreover, the above described embodiments apply to any CMOS process flow using dual epitaxy such as FinFETs, nanowires, ETSOI, planar bulk, PDSOI, etc. In the ETSOI case, the epitaxially grown on the surface of the ETSOI layer. Thus, in some cases the epitaxially grown source/drain may be referred to as a raised source/drain (RSD). In the FinFET/nanowire case, adjacent fins/nanowires may be merged or unmerged after the formation of the epitaxially grown source/drain. In the planar bulk/PDSOI case, the epitaxially grown source/drain may be formed after recessing a portion of the semiconductor substrate, resulting in at least a portion of the epitaxially grown source/drain embedded in the substrate. In this case the structure is referred to as embedded source/drain (eSD).

Figure 9:
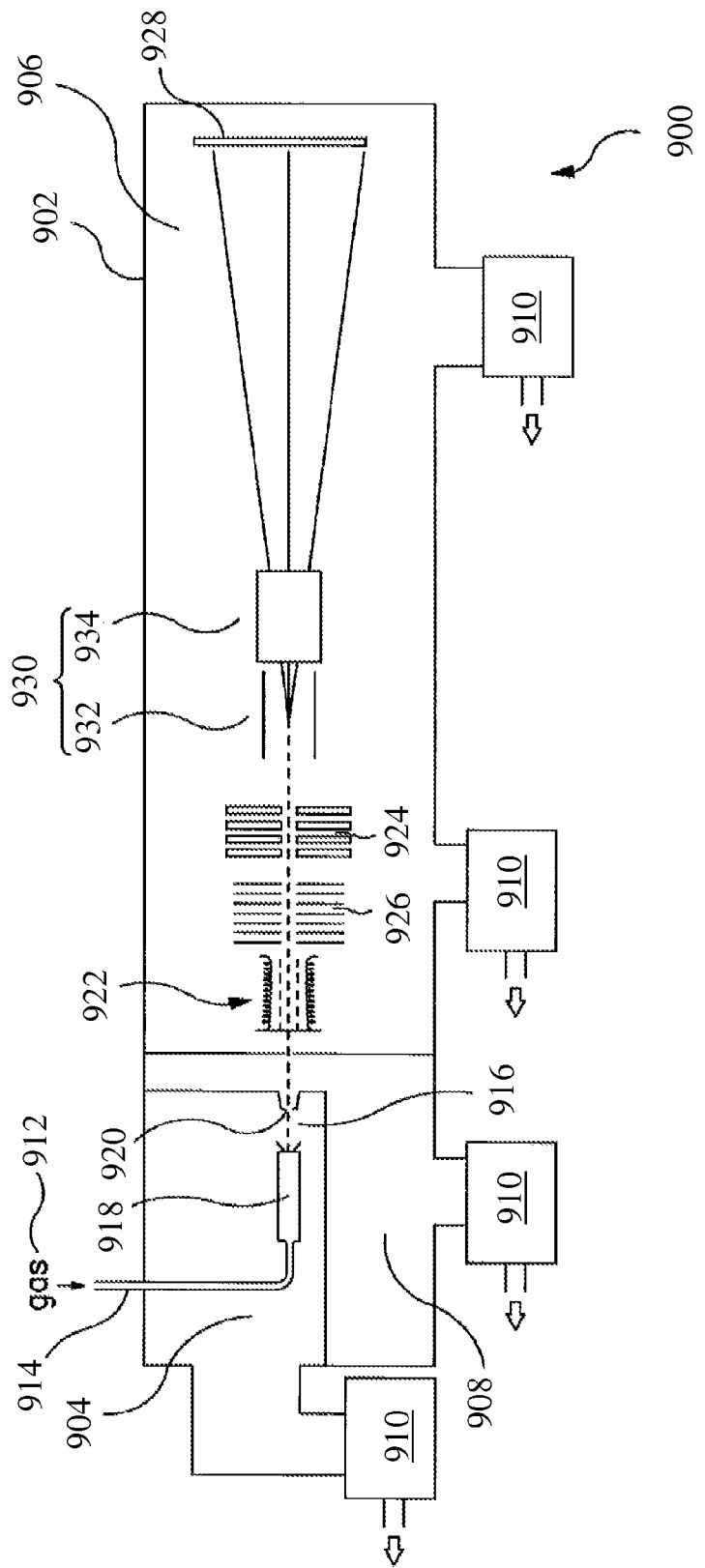
FIG. 9 illustrates an exemplary processor for performing GCIB processing.

Finally, FIG. 9 illustrates an exemplary processor 900 for performing GCIB processing as described above. The processor 900 is enclosed in a vacuum vessel 902 having a source chamber 904 and a processing chamber 906. Although not required, it may sometimes be desirable to also employ a differential vacuum pumping chamber 908 to help isolate the downstream regions from the higher pressure upstream regions. The interior of the vacuum vessel 902 is maintained at a vacuum reduced pressure by one or more vacuum pumps 910. A source gas 912 is introduced through a gas feed tube 914. Gas clusters 916 are formed by creating a supersonic jet of source gas through a properly shaped nozzle 918 into the source chamber 904, which is at a substantially reduced pressure.

Cooling resulting from the expansion causes the gas to condense into clusters of, for example, from several to several thousand atoms or molecules. A gas skimmer aperture 920 is used to separate the gas products that have not been converted into a cluster jet from the cluster jet so as to minimize pressure in the downstream regions where such higher pressures would be detrimental (e.g., ionizer 922, accelerator high voltage electrodes 924, and processing chamber 906). Suitable source gases 912 include, for example, argon, other inert gases, oxygen, nitrogen, oxygen bearing gases such as carbon dioxide, and silicon bearing gases. After the cluster jet has been formed, the clusters 916 are ionized in an ionizer 922. The ionizer 922 may be an electron impact ionizer that produces thermoelectrons from one or more incandescent filaments and accelerates and directs the electrons causing them to collide with the gas clusters 916 in the gas cluster jet where it passes through the ionizer 922. The electron impact ejects electrons from the clusters, causing the clusters to become positively ionized.

A set of suitably biased high voltage lens electrodes 926 extracts the cluster ions from the ionizer and focuses them to form a gas cluster ion beam. Another set of high voltage accelerator electrodes 924 accelerates the beam to a desired energy, for example, from 1 keV to several tens of keV. The accelerated beam is directed at a substrate 928 for GCIB processing. Although not specifically illustrated in FIG. 9, is a mass selector may be utilized for selecting clusters of a certain mass or within a certain range of masses. Such a mass selector can be, for example, a weak transverse magnetic field for deflecting monomer ions and other light ions (e.g., those cluster ions often or fewer atoms or molecules) out of the beam and passing more massive cluster ions.

Since the silicon rich layer infusion application contemplates processing of large diameter wafers with spatially uniform results, a scanning system 930 is may be used in order to uniformly scan the GCIB across large areas to produce spatially homogeneous results. In this regard, two pairs of orthogonally oriented electrostatic scan plates 932 and 934 make up scanning system 930, and having suitable beam scanning voltage waveforms imposed can be utilized to produce a raster or other scanning pattern across the desired area.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A complementary metal oxide semiconductor (CMOS) device, comprising:
    a substrate;
    gate structures formed in both a first polarity type region and a second polarity type region of the substrate, the gate structures having sidewall spacers adjacent thereto;
    first epitaxially grown source/drain (SD) regions formed in the first polarity type region;
    a protection layer selectively formed only on surfaces of the first epitaxially grown SD regions, the protection layer being excluded from upper surfaces of the gate structures located in the first epitaxially grown SD regions;
    second epitaxially grown SD regions formed in the second polarity type region; and first and second electrically conductive SD contacts, an end of the first electrically conductive SD contacts formed on an upper surface of the first epitaxially grown SD regions and an end of the second electrically conductive SD contacts formed on an upper surface of the second epitaxially grown SD regions, wherein a portion of the first electrically conductive SD contacts are surrounded by the protection layer.

2. The device of claim 1, wherein the selectively formed protection layer only on exposed surfaces of the first epitaxially grown SD regions comprises a gas cluster ion beam (GCIB) nitride layer.

3. The device of claim 1, wherein the sidewall spacers comprise a low-k material.

4. The device of claim 1, wherein adjacent gate structures have a pitch spacing of about 45 nanometers (nm).

5. The device of claim 4, wherein the nitride material is formed at a thickness of about 9 nm such that an opening between adjacent gate structures is about 12 nm.

\* \* \* \* \*